(12) United States Patent
Chen et al.

(10) Patent No.: US 7,598,155 B1
(45) Date of Patent: Oct. 6, 2009

(54) METHOD OF MANUFACTURING AN OVERLAY MARK

(75) Inventors: Min-Hung Chen, Hsinchu County (TW); Kao-Tsair Tsai, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 12/111,598

(22) Filed: Apr. 29, 2008

(51) Int. Cl.
*H01L 21/78* (2006.01)
*H01L 21/46* (2006.01)
*H01L 21/301* (2006.01)

(52) U.S. Cl. .............. 438/462; 438/257; 438/424; 438/425

(58) Field of Classification Search ............ None
See application file for complete search history.

(56) References Cited

U.S. PATENT DOCUMENTS

| | | | | |
|---|---|---|---|---|
| 5,786,260 A | * | 7/1998 | Jang et al. | 438/401 |
| 5,949,145 A | * | 9/1999 | Komuro | 257/797 |
| 6,043,133 A | * | 3/2000 | Jang et al. | 438/401 |
| 6,316,328 B1 | * | 11/2001 | Komuro | 438/401 |
| 6,798,038 B2 | * | 9/2004 | Sato et al. | 257/510 |
| 7,423,312 B1 | * | 9/2008 | Torii | 257/315 |
| 2007/0194466 A1 | * | 8/2007 | Yamaguchi | 257/797 |

\* cited by examiner

*Primary Examiner*—Zandra Smith
*Assistant Examiner*—Khanh B Duong
(74) *Attorney, Agent, or Firm*—J.C. Patents

(57) ABSTRACT

A method of manufacturing an overlay mark is provided. Two first X-direction isolation structures, two first Y-direction isolation structures, two second X-direction isolation structures, and two second Y-direction isolation structures are formed in a substrate, where the first X-direction isolation structures and the first Y-direction isolation structures are arranged to a first rectangle, and the second X-direction isolation structures and the second Y-direction isolation structures are arranged to a second rectangle. The second rectangle is located in the first rectangle. A first dielectric layer and a conductive layer are formed sequentially on the substrate. A planarization process is performed to remove a portion of the conductive layer till the isolation structures are exposed. A second dielectric layer is formed on the substrate. A rectangle pattern is formed on the second dielectric layer. The sides of the rectangle pattern are located above the isolation structures.

17 Claims, 4 Drawing Sheets

METHOD OF MANUFACTURING AN OVERLAY MARK

BACKGROUND OF THE INVENTION

1. Field of the Invention

The present invention generally relates to an overlay mark and a method of manufacturing the same, in particular, to an overlay mark and a method of manufacturing the same which may avoid influencing a measurement result of alignment accuracy and prevent occurrence of defects.

2. Description of Related Art

Currently, under the circumstance that integration of a semiconductor process is gradually enhanced, steps of the process become more and more complicated and troublesome. Therefore, it has become the developing direction of each semiconductor process manufacturer that how to use a real-time measurement apparatus in a process to monitor the process and promptly report defects, so as to reduce the loss caused by process errors.

As the line width of an integrated circuit (IC) process is continuously reduced, key success factors of a lithography process of a wafer include not only the control of critical dimensions (CD), but also alignment accuracy, which is quite important. Therefore, the measurement of the alignment accuracy is a critical step in the semiconductor process. An overlay mark is a mark for measuring an overlay error, and used to determine whether a photoresist pattern formed in the lithography process is aligned accurately with a pattern of a former layer.

Generally speaking, in a common non-volatile memory process, the following problems usually occur when measuring the alignment accuracy.

The non-volatile memory process includes forming isolation structures on a substrate; then, sequentially forming a dielectric layer serving as a material of a tunneling dielectric layer and a conductive layer serving as a material of a floating gate on the substrate; next, performing a planarization process to remove a portion of the conductive layer till the isolation structures are exposed; afterwards, forming a second dielectric layer on the substrate to serve as a material of an inter-gate dielectric layer; and finally, forming a photoresist pattern on the second dielectric layer, so as to perform a subsequent patterning process to define the inter-gate dielectric layer.

After the photoresist pattern is formed, the alignment accuracy is measured, so as to prevent generating an unexpected overlay error between the patterned second dielectric layer and a pattern of a former layer. The method of measuring an overlay error includes forming a photoresist pattern on the second dielectric layer on the isolation structures in the peripheral area while forming the photoresist pattern for defining the inter-gate dielectric layer, and then comparing the photoresist pattern in the peripheral area with the patterns of other isolation structures.

However, when the isolation structures are formed by using a chemical mechanical polishing (CMP) method, a dishing phenomenon often appears on the isolation structures due to low active area pattern density of the substrate, further resulting in that the conductive layer is remained on the isolation structures in the planarization process. Therefore, when measuring the alignment accuracy, the remained conductive layer will cause errors in a measurement signal, thereby influencing a measurement result or causing the problem that the overlay error value cannot be measured.

Furthermore, another method of measuring an overlay error includes forming the photoresist pattern serving as an overlay mark on the second dielectric layer in the active area in the peripheral area, and then measuring the alignment accuracy. Although this method will not influence the measurement of the alignment accuracy due to the dishing phenomenon of the isolation structures, an undercut phenomenon usually appears in a subsequent step of removing a conductive layer by a wet-etching process, resulting in removing the conductive layer under the photoresist pattern and causing the overlay mark to break down. As a result, defects are caused in the active area.

SUMMARY OF THE INVENTION

Accordingly, the present invention is directed to provide a method of manufacturing an overlay mark, so as not to influence measurement of alignment accuracy due to dishing phenomenon on the isolation structures and to prevent the overlay mark from breaking down to cause defects in an active area.

The present invention is further directed to provide an overlay mark, thereby enhancing product yield.

The present invention provides a method of manufacturing an overlay mark applicable in a non-volatile memory process. Firstly, two first X-direction isolation structures, two first Y-direction isolation structures, two second X-direction isolation structures, and two second Y-direction isolation structures are formed in a substrate. The first X-direction isolation structures and the first Y-direction isolation structures are arranged to a first rectangle, the second X-direction isolation structures and the second Y-direction isolation structures are arranged to a second rectangle, and the second rectangle is located in the first rectangle. Then, a first dielectric layer and a conductive layer are sequentially formed on the substrate. Then, a first planarization process is performed to remove a portion of the conductive layer till the first X-direction isolation structures, the first Y-direction isolation structures, the second X-direction isolation structures, and the second Y-direction isolation structures are exposed. Subsequently, a second dielectric layer is formed on the substrate. Thereafter, a rectangle pattern is formed on the second dielectric layer. The sides of the rectangle pattern are located above the second X-direction isolation structures and the second Y-direction isolation structures, respectively.

The present invention further provides an overlay mark applicable in a non-volatile memory. The overlay mark includes two first X-direction isolation structures, two first Y-direction isolation structures, two second X-direction isolation structures, two second Y-direction isolation structures, a first dielectric layer, and a conductive layer. The first X-direction isolation structures, the first Y-direction isolation structures, the second X-direction isolation structures, and the second Y-direction isolation structures are disposed in a substrate. The first X-direction isolation structures and the first Y-direction isolation structures are arranged to a first rectangle, the second X-direction isolation structures and the second Y-direction isolation structures are arranged to a second rectangle, and the second rectangle is located in the first rectangle. The first dielectric layer is disposed on a surface of the substrate. The conductive layer is disposed on the first dielectric layer.

Since active areas with high pattern density are formed in the substrate in the present invention, a dishing phenomenon may be avoided in the process of forming the isolation structures, thereby preventing the conductive layer serving as a material of a floating gate from remaining on the isolation structures in subsequent processes. Therefore, when measuring the alignment accuracy of a lithography process, the conductive layer may be prevented from remaining on the isolation structures to cause errors in the measurement signal, and avoiding the problem that the overlay error cannot be measured.

Furthermore, since the photoresist pattern serving as the current layer pattern of the overlay mark is formed on the isolation structures in the present invention, defects may be prevented from occurring in the active area when the conductive layer is removed by a wet etching process and the photoresist pattern breaks down due to undercut in the subsequent processes.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
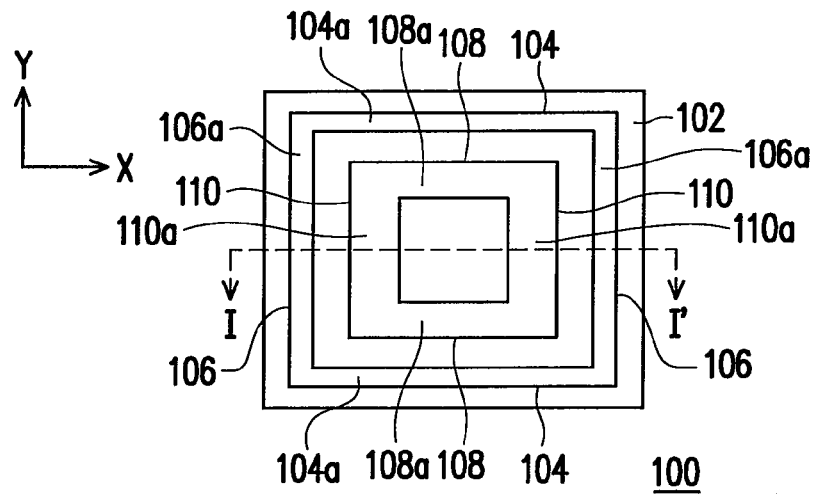
FIGS. 1A-1C are top views of the procedure of manufacturing the overlay mark according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
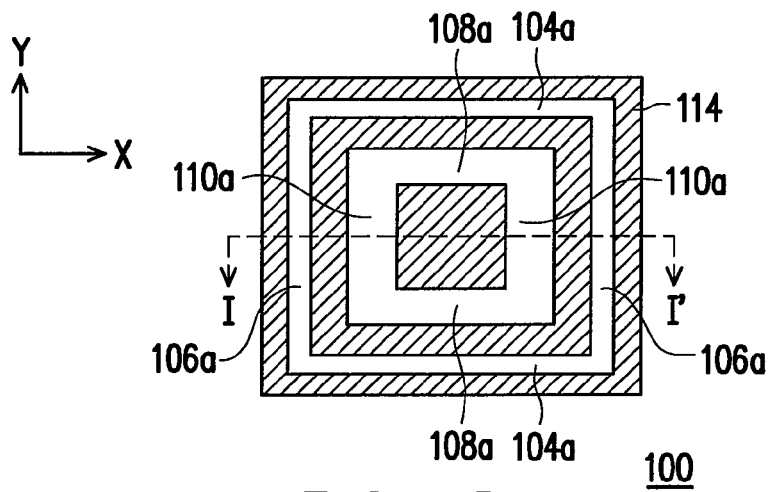
Figure 1C:
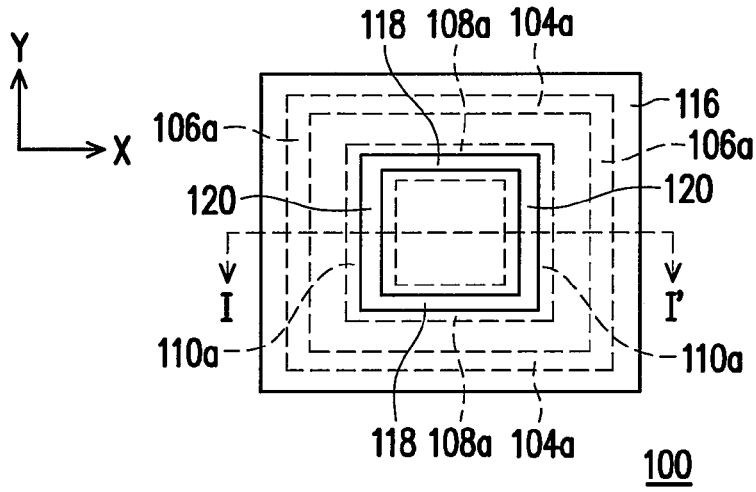
Figure 2A:
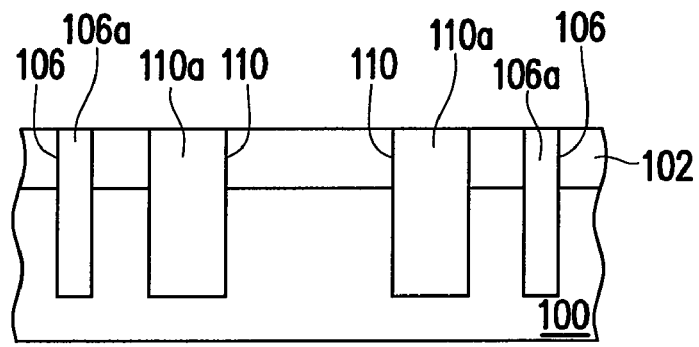
FIGS. 2A-2C are sectional views of the procedure of manufacturing the overlay mark according to the sections I-I' in FIGS. 1A-1C.
Figure 2B:
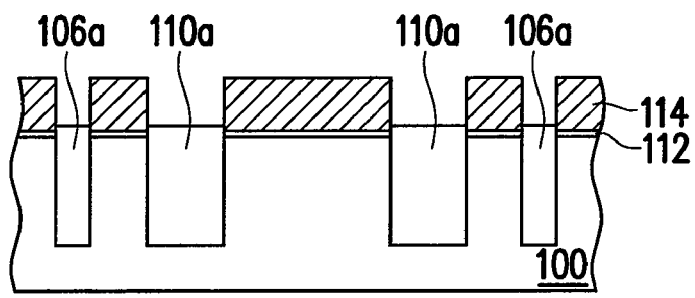
Figure 2C:
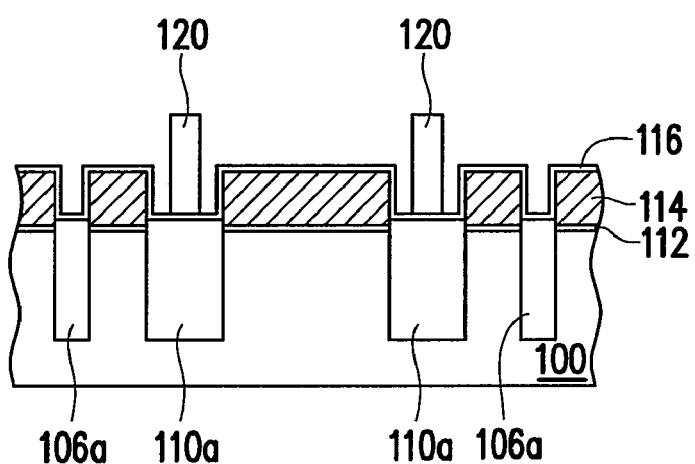

FIGS. 1A-1C are top views of the procedure of manufacturing the overlay mark according to an embodiment of the present invention. FIGS. 2A-2C are sectional views of the procedure of manufacturing the overlay mark according to the sections I-I' in FIGS. 1A-1C. It should be noted that, in the following description of the present invention, film layers in a peripheral area for forming the overlay mark and film layers in a device area for forming the non-volatile memory are all formed in the same process and steps.

Firstly, referring to FIGS. 1A and 2A, a hard mask layer 102 is formed on a substrate 100 in the peripheral area. The substrate 100 is, for example, a silicon substrate. The hard mask layer 102 is, for example, made of nitride, and formed by, for example, a chemical vapour deposition (CVD) method. Then, for example, a lithography process and an etching process are performed to form two X-direction trenches 104, two Y-direction trenches 106, two X-direction trenches 108, and two Y-direction trenches 110 in the hard mask layer 102 and the substrate 100, so as to serve as a former layer pattern of the overlay mark in the present invention. The X-direction trenches 104 and the Y-direction trenches 106 are arranged to a first rectangle, the X-direction trenches 108 and the second Y-direction trenches 110 are arranged to a second rectangle, and the second rectangle is located in the first rectangle. The width of the X-direction trenches 104 and the Y-direction trenches 106, for example, ranges from 0.4 µm to 3 µm. The width of the X-direction trenches 108 and the Y-direction trenches 110, for example, ranges from 3 µm to 8 µm.

Figure 3:
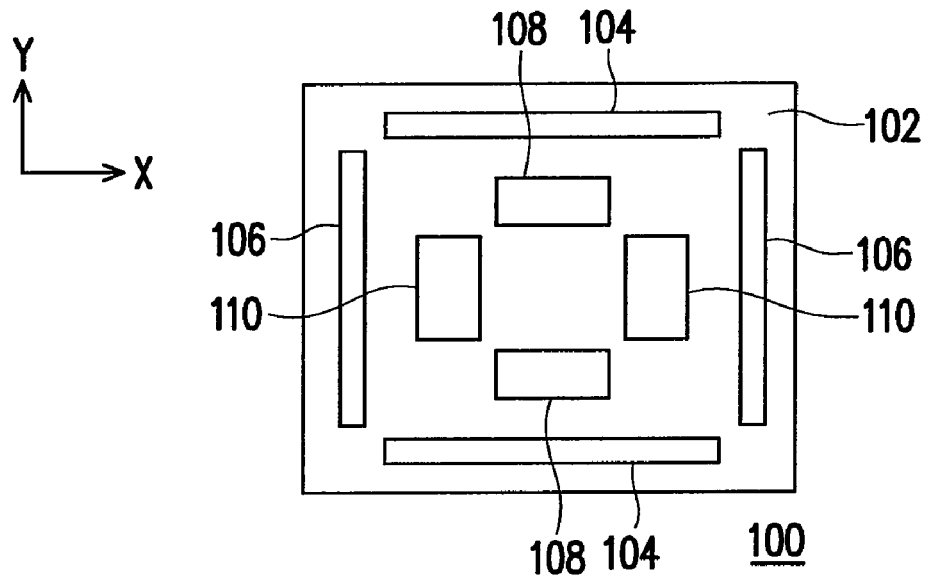
FIG. 3 is a schematic view of the configuration of the isolation structures in the overlay mark according to another embodiment of the present invention.

It should be noted that, in this embodiment, the X-direction trenches 104 and the Y-direction trenches 106 are, for example, connected, and the X-direction trenches 108 and the Y-direction trenches 110 are, for example, connected. In another embodiment, the X-direction trenches 104 and the Y-direction trenches 106 may be separated, and the X-direction trenches 108 and the Y-direction trenches 110 may be separated (as shown in FIG. 3).

Referring to FIGS. 1A and 2A, an insulating material layer (not shown) is formed on the substrate 100 to fill in the X-direction trenches 104, the Y-direction trenches 106, the X-direction trenches 108, and the Y-direction trenches 110. Subsequently, a planarization process is performed by using, for example, the chemical mechanical polishing (CMP) method to remove a portion of the insulating material layer till the hard mask layer 102 is exposed, so as to form X-direction isolation structures 104a, Y-direction isolation structures 106a, X-direction isolation structures 108a, and Y-direction isolation structures 110a. It is important that, since the second rectangle formed by arranging the X-direction trenches 108 and the second Y-direction trenches 110 is located in the first rectangle formed by arranging the X-direction trenches 104 and the Y-direction trenches 106, the pattern density of the active areas in the substrate 100 may be enhanced, so as to avoid causing a dishing phenomenon when the isolation structures are formed.

Then, referring to FIGS. 1B and 2B, for example, an etching process is performed to remove the hard mask layer 102 to expose the substrate 100. Next, a dielectric layer 112 is formed on the substrate 100 to serve as the material of a tunneling dielectric layer in the non-volatile memory. The dielectric layer 112 is, for example, made of oxide, and formed by, for example, thermal oxidation. Subsequently, a conductive layer 114 is formed on the substrate 100 to serve as the material of a floating gate in the non-volatile memory. The conductive layer 114 is, for example, made of doped polysilicon, and formed by, for example, the chemical vapour deposition (CVD) method. Subsequently, for example, the planarization process is performed by using the CMP method to remove a portion of the conductive layer 114 till the X-direction isolation structures 104a, the Y-direction isolation structures 106a, the X-direction isolation structures 108a, and the Y-direction isolation structures 110a are exposed. Then, for example, an etching-back process is performed to remove portions of the X-direction isolation structures 104a, the Y-direction isolation structures 106a, the X-direction isolation structures 108a, and the Y-direction isolation structures 110a, so as to expose sidewalls of the conductive layer 114. The sidewalls of the conductive layer 114 are exposed to increase the overlapping area between a control gate formed in the following process and the floating gate, thereby enhancing a coupling ratio.

Subsequently, referring to FIGS. 1C and 2C, a dielectric layer 116 is conformally formed on the substrate 100, and used as the material of an inter-gate dielectric layer in the non-volatile memory. The dielectric layer 116 is for example, a composite layer structure composed of an oxide layer/a nitride layer/an oxide layer, and is formed by, for example, forming a first oxide layer by thermal oxidation; forming a nitride layer on the first oxide layer by the CVD method; and subsequently, forming a second oxide layer on the nitride layer by thermal oxidation. Definitely, in other embodiments, the dielectric layer 116 may also be the oxide layer directly formed by the CVD method.

Referring to FIGS. 1C and 2C, a rectangle pattern is formed on the dielectric layer 116, and the sides of the rectangle pattern are located above the X-direction isolation structures 108a and the Y-direction isolation structures 110a, respectively. More specifically, the rectangle pattern is, for example, a photoresist pattern, and the photoresist pattern in the device area is used as an etching mask for defining the dielectric layer 116 as the inter-gate dielectric layer, while the photoresist pattern in the peripheral area is used as the current layer pattern of the overlay mark in the present invention. The photoresist pattern includes, for example, two X-direction patterns 118 and two Y-direction patterns 120, in which the X-direction patterns 118 are located above the X-direction isolation structures 108a, and the Y-direction patterns 120 are located above the Y-direction isolation structures 110a. Since the width of the X-direction trenches 108 and the Y-direction trenches 110, for example, ranges from 3 µm to 8 µm, and the X-direction patterns 118 are located above the X-direction isolation structures 108a and the Y-direction patterns 120 are located above the Y-direction isolation structures 110a, the X-direction patterns 118 or Y-direction patterns 120 may be prevented from breaking down due to undercut in the subsequent steps of removing the conductive layer 114 by a wet-etching process so that generating defects in the active area.

Figure 4:
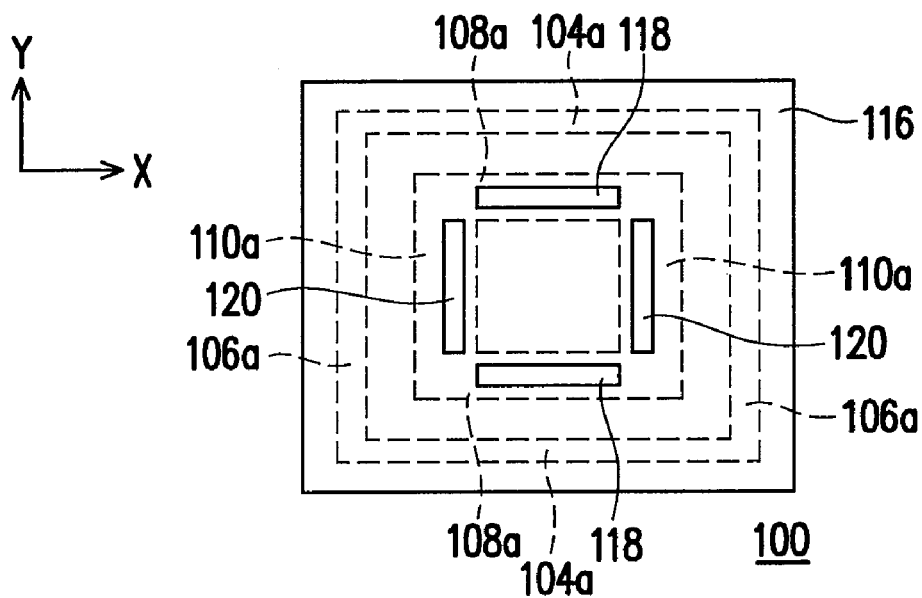
FIG. 4 is a schematic view of the configuration of the photoresist pattern in the overlay mark according to a further embodiment of the present invention.

It should be noted that, in this embodiment, the X-direction patterns 118 and the Y-direction patterns 120 are, for example, connected. In another embodiment, the X-direction patterns 118 and the Y-direction patterns 120 may also be separated (as shown in FIG. 4).

After the rectangle pattern is formed, the overlay mark in the present invention is manufactured. Subsequently, the alignment accuracy is measured. The alignment accuracy of the lithography process defining the inter-gate dielectric layer in the Y direction is inspected by measuring whether a centre line of the two X-direction isolation structures 104a and a centre line of the two X-direction patterns 118 are overlapped, or whether a distance between the two centre lines is in a tolerable range of errors. Likewise, the alignment accuracy of the lithography process defining the inter-gate dielectric layer in the X direction may be inspected through measuring the centre line of the two Y-direction isolation structures 106a and the centre line of the two Y-direction patterns 120.

Figure 5:
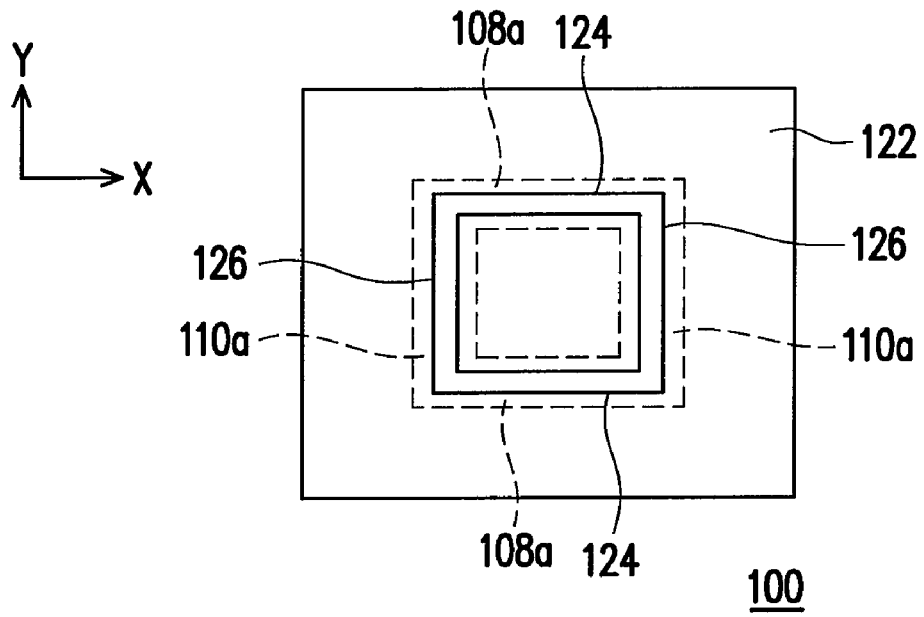
FIG. 5 is a schematic view of the configuration of the photoresist pattern in the overlay mark according to still another embodiment of the present invention.

Furthermore, in this embodiment, stripped photoresist patterns in the X and Y directions are used as the current layer pattern of the overlay mark. In another embodiment, stripped gaps in the photoresist pattern 122 are used as the current layer pattern of the overlay mark (as shown in FIG. 5), and the method of measuring the alignment accuracy is similar to that in this embodiment. That is, the alignment accuracy of the lithography process defining the inter-gate dielectric layer in the Y direction is inspected by measuring the centre line of the two X-direction isolation structures (not shown) and the centre line of the two X-direction gaps 124, and the alignment accuracy of the lithography process defining the inter-gate dielectric layer in the X direction is inspected by measuring the centre line of the two Y-direction isolation structures (not shown) and the centre line of the two Y-direction gaps 126. It is important that the stripped gaps in the photoresist pattern 122 are still located above the X-direction isolation structures 108a and the Y-direction isolation structures 110a.

Figure 6:
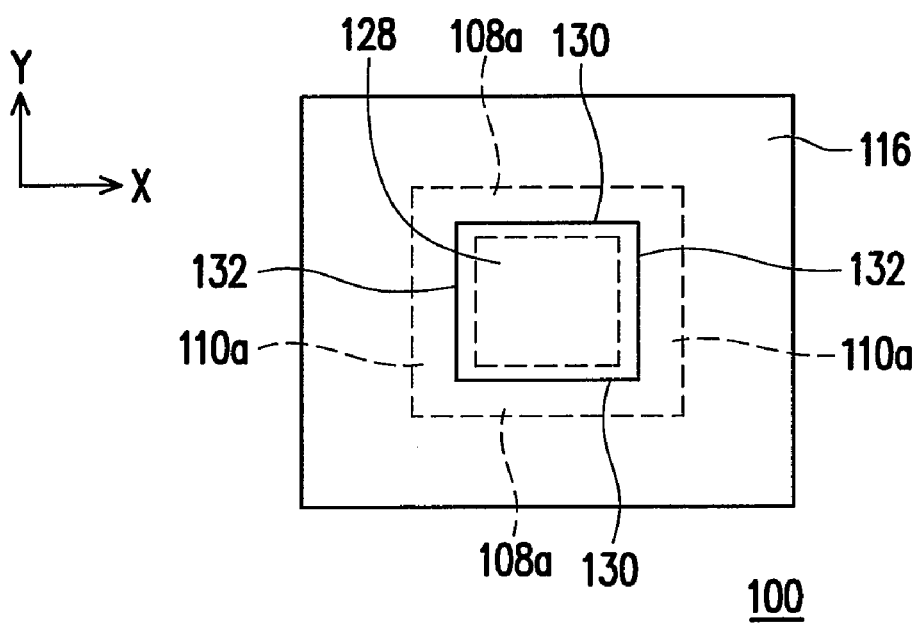
FIG. 6 is a schematic view of the configuration of the photoresist pattern in the overlay mark according to still a further embodiment of the present invention.

Additionally, in other embodiments, the X-direction patterns 118 and the Y-direction patterns 120 may also be replaced with a rectangle block photoresist pattern 128 (as shown in FIG. 6). The rectangle block photoresist pattern 128 is located above the second rectangle formed through arranging the X-direction trenches 108 and the second Y-direction trench 110, and the sides of the photoresist pattern 128 are located above the X-direction isolation structures 108a and Y-direction isolation structures 110a, respectively. In this embodiment, the alignment accuracy of the lithography process defining the inter-gate dielectric layer in the Y direction is inspected through measuring the centre line of the two X-direction isolation structures (not shown) and the centre line of the two X-direction side lines 130 of the rectangle block photoresist pattern 128, and the alignment accuracy of the lithography process defining the inter-gate dielectric layer in the X direction is inspected through measuring the centre line of the two Y-direction isolation structures (not shown) and the centre line of the two Y-direction sides 132 of the rectangle block photoresist pattern 128.

In view of the above, since active areas with high pattern density are formed in the substrate in the present invention, a dishing phenomenon may be avoided in the process of forming the isolation structures, thereby preventing the conductive layer serving as a material of a floating gate from remaining on the isolation structures in following processes. Therefore, when measuring the alignment accuracy of a lithography process, the conductive layer may be prevented from remaining on the isolation structures to cause errors in the measurement signal, and avoiding the problem that the overlay error cannot be measured.

Furthermore, since the photoresist pattern serving as the current layer pattern of the overlay mark is formed on the isolation structures in the present invention, defects may be prevented from occurring in the active area when the conductive layer is removed by a wet etching process and the photoresist pattern breaks down due to undercut in the subsequent processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an overlay mark, applicable in a non-volatile memory process, comprising:

forming two first X-direction isolation structures, two first Y-direction isolation structures, two second X-direction isolation structures, and two second Y-direction isolation structures in a substrate, wherein the first X-direction isolation structures and the first Y-direction isolation structures are arranged to a first rectangle, the second X-direction isolation structures and the second Y-direction isolation structures are arranged to a second rectangle, and the second rectangle is located in the first rectangle;

sequentially forming a first dielectric layer and a conductive layer on the substrate;

performing a first planarization process to remove a portion of the conductive layer, till the first X-direction isolation structures, the first Y-direction isolation structures, the second X-direction isolation structures, and the second Y-direction isolation structures are exposed;

forming a second dielectric layer on the substrate; and forming a rectangle pattern on the second dielectric layer, wherein sides of the rectangle pattern are located above the second X-direction isolation structures and the second Y-direction isolation structures, respectively.

2. The method of manufacturing an overlay mark as claimed in claim 1, wherein a width of the second X-direction isolation structures and the second Y-direction isolation structures ranges from 3 µm to 8 µm.

3. The method of manufacturing an overlay mark as claimed in claim 1, wherein a width of the first X-direction isolation structures and the first Y-direction isolation structures ranges from 0.4 µm to 3 µm.

4. The method of manufacturing an overlay mark as claimed in claim 1, wherein the first X-direction isolation structures and the first Y-direction isolation structures are connected.

5. The method of manufacturing an overlay mark as claimed in claim 1, wherein the first X-direction isolation structures and the first Y-direction isolation structures are separated.

6. The method of manufacturing an overlay mark as claimed in claim 1, wherein the second X-direction isolation structures and the second Y-direction isolation structures are connected.

7. The method of manufacturing an overlay mark as claimed in claim 1, wherein the second X-direction isolation structures and the second Y-direction isolation structures are separated.

8. The method of manufacturing an overlay mark as claimed in claim 1, wherein the rectangle pattern is a photoresist pattern.

9. The method of manufacturing an overlay mark as claimed in claim 1, wherein the rectangle pattern is a gap in a photoresist pattern.

10. The method of manufacturing an overlay mark as claimed in claim 1, wherein the rectangle pattern comprises two X-direction patterns and two Y-direction patterns, the X-direction patterns are located above the second X-direction isolation structures, respectively, and the Y-direction patterns are located above the second Y-direction isolation structures, respectively.

11. The method of manufacturing an overlay mark as claimed in claim 10, wherein the X-direction patterns and the Y-direction patterns are connected.

12. The method of manufacturing an overlay mark as claimed in claim 10, wherein the X-direction patterns and the Y-direction patterns are separated.

13. The method of manufacturing an overlay mark as claimed in claim 1, wherein the method of forming the first X-direction isolation structures, the first Y-direction isolation structures, the second X-direction isolation structures, and the second Y-direction isolation structures comprises:

forming a hard mask layer on the substrate;

forming two first X-direction trenches, two first Y-direction trenches, two second X-direction trenches, and two second Y-direction trenches in the hard mask layer and the substrate;

forming an insulating material layer on the substrate;

performing a second planarization process to remove a portion of the insulating material layer till the hard mask layer is exposed; and removing the hard mask layer.

14. The method of manufacturing an overlay mark as claimed in claim 1, after performing the first planarization process but before forming the second dielectric layer, further comprising performing an etching-back process, so as to remove portions of the first X-direction isolation structures, the first Y-direction isolation structures, the second X-direction isolation structures, and the second Y-direction isolation structures.

15. The method of manufacturing an overlay mark as claimed in claim 1, wherein a material of the conductive layer comprises doped polysilicon.

16. The method of manufacturing an overlay mark as claimed in claim 1, wherein a material of the first dielectric layer comprises oxide.

17. The method of manufacturing an overlay mark as claimed in claim 1, wherein a material of the second dielectric layer comprises oxide/nitride/oxide.

* * * * *